United States Patent
Krishnaswamy et al.

(10) Patent No.: US 12,282,261 B2
(45) Date of Patent: Apr. 22, 2025

(54) SYSTEMS AND METHODS FOR DIRECT LASER WRITING

(71) Applicant: Northwestern University, Evanston, IL (US)

(72) Inventors: Sridhar Krishnaswamy, Lake Forest, IL (US); Heming Wei, Shanghai (CN); Wisnu Hadibrata, Evanston, IL (US); Koray Aydin, Wilmette, IL (US)

(73) Assignee: Northwestern University, Evanston, IL (US)

( * ) Notice: Subject to any disclaimer, the term of this patent is extended or adjusted under 35 U.S.C. 154(b) by 665 days.

(21) Appl. No.: 17/515,841

(22) Filed: Nov. 1, 2021

(65) Prior Publication Data
US 2022/0171293 A1    Jun. 2, 2022

Related U.S. Application Data

(60) Provisional application No. 63/109,454, filed on Nov. 4, 2020.

(51) Int. Cl.

| | | |
|---|---|---|
| G03F 7/00 | (2006.01) | |
| B29C 64/153 | (2017.01) | |
| B29C 64/245 | (2017.01) | |
| B29C 64/268 | (2017.01) | |
| B33Y 10/00 | (2015.01) | |
| B33Y 30/00 | (2015.01) | |
| G02B 1/00 | (2006.01) | |
| G02B 6/10 | (2006.01) | |

(52) U.S. Cl.
CPC ......... *G03F 7/70416* (2013.01); *G02B 6/107* (2013.01); *G03F 7/0037* (2013.01); *B29C 64/153* (2017.08); *B29C 64/245* (2017.08); *B29C 64/268* (2017.08); *B33Y 10/00* (2014.12); *B33Y 30/00* (2014.12); *G02B 1/002* (2013.01)

(58) Field of Classification Search
None
See application file for complete search history.

(56) References Cited

U.S. PATENT DOCUMENTS

| | | | |
|---|---|---|---|
| 6,841,340 B2 * | 1/2005 | Tani .................. | B29C 64/135 430/394 |
| 2002/0061472 A1 * | 5/2002 | Cooper ............. | G03F 7/70416 430/396 |

(Continued)

OTHER PUBLICATIONS

Vesselin G. Velev et al., "Inverse-Designed Stretchable Metalens with Tunable Focal Distance," *Applied Physics Letters* Dec. 2017; pp. 1-12. DOI: 10.1063/1.5017719.

(Continued)

*Primary Examiner* — Sean M DeGuire
*Assistant Examiner* — Andrew Preston Traywick
(74) *Attorney, Agent, or Firm* — Bell & Manning, LLC

(57) ABSTRACT

Methods of fabricating an object via direct laser lithography are provided. In embodiments, such a method comprises illuminating, via an optical fiber having an end facet and a metalens directly on the end facet, a location within a photosensitive composition from which an object is to be fabricated with light, thereby inducing a multiphoton process within the photosensitive composition to generate a region of the object; and repeating the illuminating step one or more additional times at one or more additional locations to generate one or more additional regions of the object.

15 Claims, 9 Drawing Sheets

(56) References Cited

U.S. PATENT DOCUMENTS

| | | | | |
|---|---|---|---|---|
| 2016/0225477 | A1* | 8/2016 | Banine | G03F 7/70891 |
| 2019/0084241 | A1 | 3/2019 | Krishnaswamy et al. | |
| 2019/0258175 | A1* | 8/2019 | Dietrich | G03F 7/2053 |
| 2020/0284960 | A1* | 9/2020 | Ellenbogen | G02B 5/20 |

OTHER PUBLICATIONS

Alexander Y. Piggott et al., "Inverse design and demonstration of a compact and broadband on-chip wavelength demultiplexer," Ginzton Laboratory, Standford University, Standford, CA, 94305; pp. 1-15.

Jingyi Yang et al., "Photonic Crystal Fiber Metalens," *Nanophotonics* 2019; vol. 8, No. 3, pp. 443-449.

Damian Bird et al., "Two-photon fluorescence endoscopy with a micro-optic scanning head," *Optics Letters*, Sep. 1, 2003, vol. 28, No. 17; pp. 1552-1554.

Min Gu et al., "Breaking the diffraction-limited resolution barrier in fiber-optical two-photon fluorescence endoscopy by an azimuthally-polarized beam," *Scientific Reports*, vol. 4: 3627; pp. 1-6. DOI: 10.1038/srep03627.

K. Konig et al., "Clinical Two-Photon Microendoscopy," *Microscopy Research and Technique* (2007), vol. 70; pp. 398-402.

Edgar E. Morales-Delgado et al., "Two-photon imaging through a multimode fiber," *Optics Express*, Dec. 14, 2015, vol. 23, No. 25; pp. 1-13. DOI:10.1364/OE.23.032158.

Mon Thiri Myaing et al., "Fiber-optic scanning two-photon fluorescence endoscope," *Optics Letters*, Apr. 15, 2006, vol. 31, No. 8; pp. 1076-1078.

Baris N. Ozbay et al, "Three dimensional two-photon brain imaging in freely moving mice using a miniature fiber coupled microscope with active axial-scanning," Scientific Reports (2018), vol. 8:8108; pp. 1-14. DOI:10.1038/s41598-018-26326-3.

Paolo Pozzi et al., "High-throughput spatial light modulation two-photon microscopy for fast functional imaging," *Neurophotonics* (Jan.-Mar. 2015), vol. 2, No. 1; pp. 015005-1-015005-8.

Youbo Zhao et al., "Development of a versatile two-photon endoscope for biological imaging," *Biomedical Optics Express*, Nov. 1, 2010, vol. 1, No. 4; pp. 1159-1172.

Bo Li et al., "Review—Metalens-Based Miniaturized Optical Systems," *Micromachines* 2019, vol. 10, No. 310; pp. 1-21. Doi: 10.3390/mi10050310.

Maria Principe et al., "Optical fiber meta-tips," *Light: Science & Applications* (2017), vol. 6, e16226; pp. 1-10. Doi:10.1038/lsa.2016.226.

Jacob Engelberg et al., "The advantages of metalenses over diffractive lenses," *Nature Communications* (2020), vol. 11:1991; pp. 1-4. https://doi.org/10.1038/s41467-020-15972-9.

Wisnu Hadibrata et al., "Inverse Design and 3D Printing of a Metalens on an Optical Fiber Tip for Direct Laser Lithography," *Nano Lett.* 2021, vol. 21; pp. 2422-2428.

\* cited by examiner

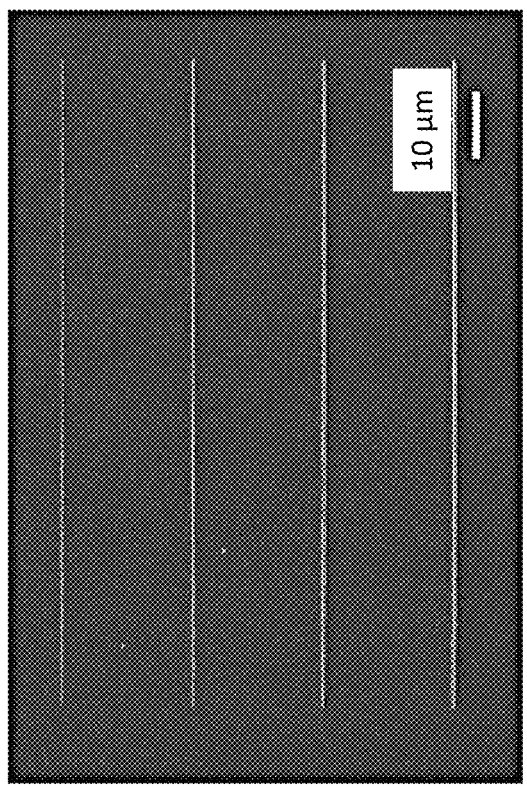

SYSTEMS AND METHODS FOR DIRECT LASER WRITING

CROSS-REFERENCE TO RELATED APPLICATIONS

The present application claims priority to U.S. provisional patent application No. 63/109,454 that was filed Nov. 4, 2020, the entire contents of which are incorporated herein by reference.

REFERENCE TO GOVERNMENT RIGHTS

This invention was made with government support under grant number N00014-16-1-3021 awarded by the Office of Naval Research (ONR). The government has certain rights in the invention.

BACKGROUND

Direct laser lithography has been used to fabricate a variety of structures with high resolution. The quality of the fabricated structures is generally dictated by the quality of the lens system employed in the direct laser lithographic system. For this reason, such systems generally make use of a high-quality free-space microscope objective with a high numerical aperture for focusing the laser light into the photosensitive composition from which the structure is to be fabricated.

SUMMARY

The present disclosure provides new systems and methods for fabricating objects via direct laser lithography.

Methods of fabricating an object via direct laser lithography are provided. In embodiments, such a method comprises illuminating, via an optical fiber having an end facet and a metalens directly on the end facet, a location within a photosensitive composition from which an object is to be fabricated with light, thereby inducing a multiphoton process within the photosensitive composition to generate a region of the object; and repeating the illuminating step one or more additional times at one or more additional locations to generate one or more additional regions of the object.

Another method of fabricating an object via direct laser lithography comprises illuminating a photosensitive composition with light focused along a first optical path, thereby inducing a multiphoton process within the photosensitive composition to generate a region of the object; illuminating the photosensitive composition with light focused along a second optical path different from the first optical path, thereby inducing another multiphoton process within the photocenter composition to generate a second region of the object; and illuminating the photosensitive composition with light focused along a third optical path different from the first and second optical paths, thereby inducing another multiphoton process within the photosensitive composition to generate a third region of the object.

Systems for fabricating an object via direct laser lithography are also provided. In embodiments, such a system comprises a support structure configured to provide a photosensitive composition from which an object is to be fabricated; an optical fiber having an end facet and a metalens directly on the end facet; an optical assembly configured to provide light to the optical fiber; and a controller operably coupled to the optical assembly, the controller comprising a processor and a non-transitory computer-readable medium operably coupled to the processor, the non-transitory computer-readable medium comprising instructions that, when executed by the processor, perform operations comprising: illuminating, via the optical fiber having the end facet and the metalens directly on the end facet, a location within the photosensitive composition with the light, thereby inducing a multiphoton process within the photosensitive composition to generate a region of the object; and repeating the illuminating step one or more additional times at one or more additional locations to generate one or more additional regions of the object.

Other principal features and advantages of the disclosure will become apparent to those skilled in the art upon review of the following drawings, the detailed description, and the appended claims.

BRIEF DESCRIPTION OF THE DRAWINGS

Illustrative embodiments of the disclosure will hereafter be described with reference to the accompanying drawings.

FIG. 4B shows an image of different lines that resulted from different laser powers of 6, 7, 8, and 9 mW from the top to the bottom.

DETAILED DESCRIPTION

Figure 3B:
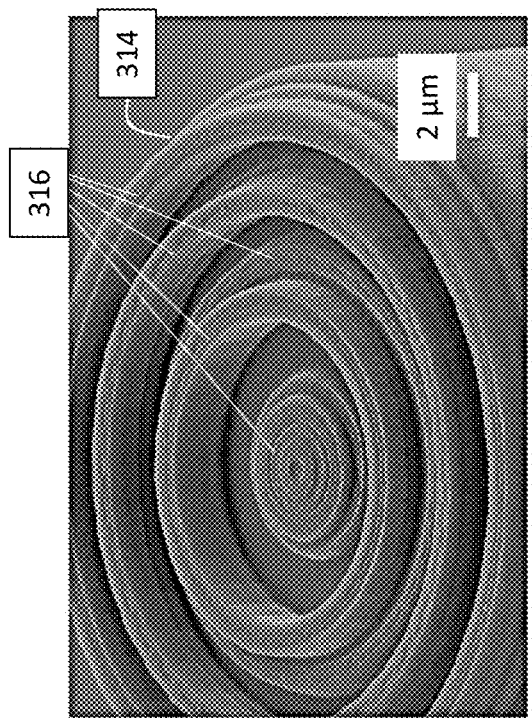
FIG. 3B shows an enlarged view of the fabricated metalens-tipped optical fiber.
Figure 3A:
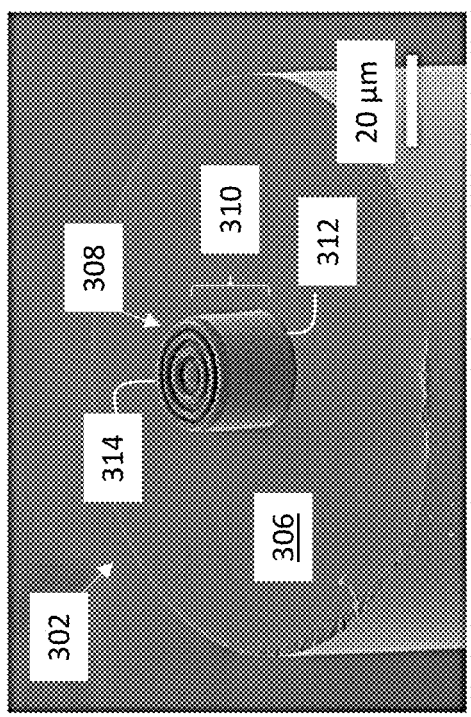
FIG. 3A shows a SEM image of the fabricated metalens-tipped optical fiber used in an illustrative system for fabricating objects via direct laser lithography.
Figure 3C:
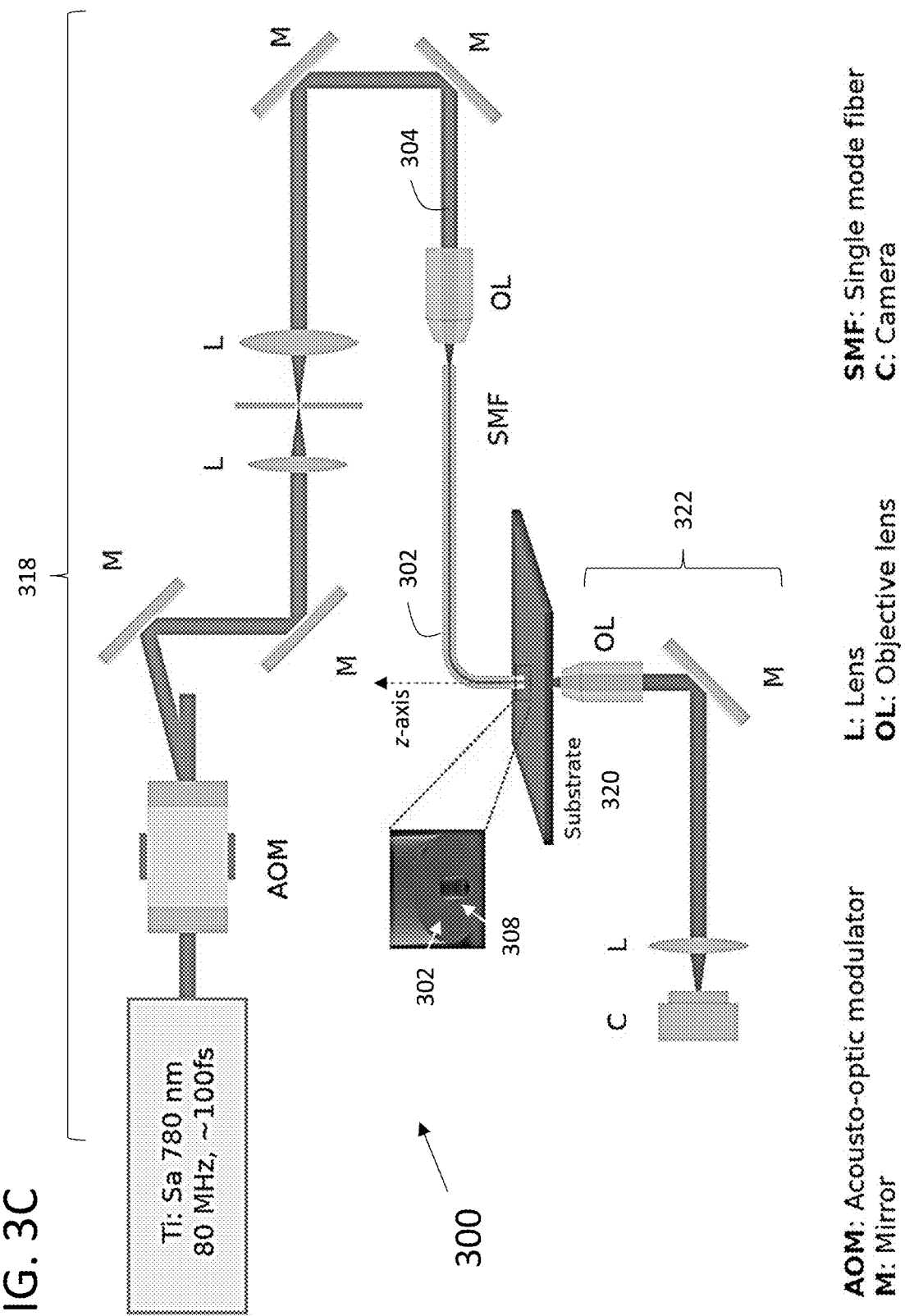
FIG. 3C shows a schematic of the homemade system, employing the fabricated metalens-tipped optical fiber for focusing light.

Systems for fabricating objects via direct laser lithography are provided. An illustrative such system 300 is shown in FIG. 3C. The system 300 comprises an optical fiber 302 configured to focus light 304 within a photosensitive composition. The focused light induces a multiphoton (e.g., two-photon) process (generally a polymerization reaction) within the photosensitive composition to form a region (voxel) of a desired object. A scanning electron microscope (SEM) image of the optical fiber 302 is shown in FIG. 3A. The optical fiber 302 has an end facet 306 and a metalens 308 mounted on (the term "on" encompasses directly on) the end facet 306. The optical fiber 302 is a single mode fiber having an optical core of about 9 µm. However, the type of optical fiber/core dimension are not meant to be limiting. Other optical fibers may be used, depending upon the application environment (such as wavelength of light being used; type of photosensitive composition being used, whether the light travels through air as shown in FIG. 3C or alternatively, a liquid; etc).

The metalens 308 of the optical fiber 302 comprises an expansion waveguide 310 having opposing end surfaces 312, 314. One end surface 312 is mounted on the end facet 306 of the optical fiber 302. The opposing end surface 314 is the optically functional surface of the metalens 308. The optically functional surface 314 of metalens 308 is shaped in the form of a plurality of raised concentric rings 316 (see the zoomed-in version in FIG. 3B and FIGS. 1A and 1B). This pattern of raised concentric rings 316 converts an incoming plane wave into a spherical wavefront having a distinct focal spot. (See FIG. 2B.) The width/diameter of the optically functional surface 314 may be adjusted depending upon the desired focal length. Other metalenses having other types of optically functional surfaces may be used, depending upon the application environment. The optically functional surface 314 of metalens 308 was designed using an objective first, inverse design method, as described in detail in the Example below. Such a method may be used to achieve other suitable metalenses having other optically functional surfaces, depending upon the application environment. Fabrication of the metalens 308 (as well as other metalenses) may be carried out by printing the metalens on the end facets of optical fibers using direct laser lithography as described in detail in the Example below. Regarding the expansion waveguide 310, this structure allows light being guided within the core of the optical fiber to gradually expand to a desired dimension, e.g., a width/diameter of the optically functional surface 314 of the metalens 308. Dimensions of the expansion waveguide may be selected depending upon the desired optical fiber as well as the desired optically functional surface.

Various materials may be used for the metalens 308 depending upon the application environment, provided the material is transparent to the light being focused. A buffer layer of a material capable of minimizing reflections at the interface of the end facet 306 of the optical fiber 302 and the end surface 312 of the expansion waveguide 310 may be used. However, a buffer layer is not necessary in every embodiment. In addition, the direct mounting of the metalens 308 onto the end facet 306 as described above is intended to encompass embodiments which do not use such a buffer layer as well as embodiments which do.

Turning back to FIG. 3C, the system 300 also comprises an optical assembly 318 configured to provide the desired light to the optical fiber 302. The optical assembly 318 comprises various optical and/or electronic components capable of generating, directing, and/or manipulating light such as a light source (e.g., a laser), an acoustic optical modulator, mirrors, lenses, objective lenses, etc. However, the number, type, and positioning of these components is not meant to be limiting. Various wavelength(s) of light may be used, provided it is capable of inducing a multiphoton (e.g., two-photon) absorption process in the desired photosensitive composition. For example, the light may comprise a wavelength in the visible (e.g., about 400 nm to about 700 nm) or near-infrared portion (e.g., about 700 to about 2500 nm) of the electromagnetic spectrum. Similarly, various powers/intensities of the light may be used.

The photosensitive composition being illuminated is the composition from which the object to be fabricated is formed. Various photosensitive compositions may be used, including negative and positive photoresist resin materials. Other components may be included in the photosensitive composition as desired, e.g., glass, ceramic, metallic, semiconductor particles; pigments; etc. As shown in FIG. 3C, a support structure, e.g., a substrate 320, may be used to hold/contain the photosensitive composition. Other types of support structures may be used, e.g., vats, tanks, chambers, including microfluidic versions of these types of support structures.

Although not shown in FIG. 3C, the system 300 generally allows for the position of the focused light and the photosensitive composition to be moved relative to one another. However, this may be accomplished in various ways, e.g., by mounting the photosensitive composition/support structure on a multi-axis stage and/or tilt platform or by scanning the optical fiber 302. The relative movement of the focal spot and the photosensitive composition enables multiple, different regions of photosensitive composition to be illuminated, thus fabricating multiple regions and ultimately, the entire, of the desired object.

As shown in FIG. 3C, the system 300 may include another optical assembly, such as one 322 comprising a camera and other components configured to facilitate alignment along the z-axis, locate the interface of the substrate and the photosensitive composition, image the substrate 320 during fabrication of the desired object, etc.

Although not shown in FIG. 3C, the system 300 generally also includes a controller configured to control one or more components of the system 300. Such a controller may include an input interface, an output interface, a communication interface, a computer-readable medium, a processor, and an application. The controller may be a computer of any form factor including an electrical circuit board. The processor operably couples with the input interface, the output interface, with the computer-readable medium, and with the communication interface to receive, to send, and to process information. The application may be implemented in software (comprise of computer-readable and/or computer-executable instructions) stored in the computer-readable-medium and accessible by the processor for execution of the instructions that embody the operations of the application. These operations generally include those associated with controlling components of the system, including operations for illuminating the photosensitive composition using the optical fiber 302 to fabricate the desired object.

Figure 4A:
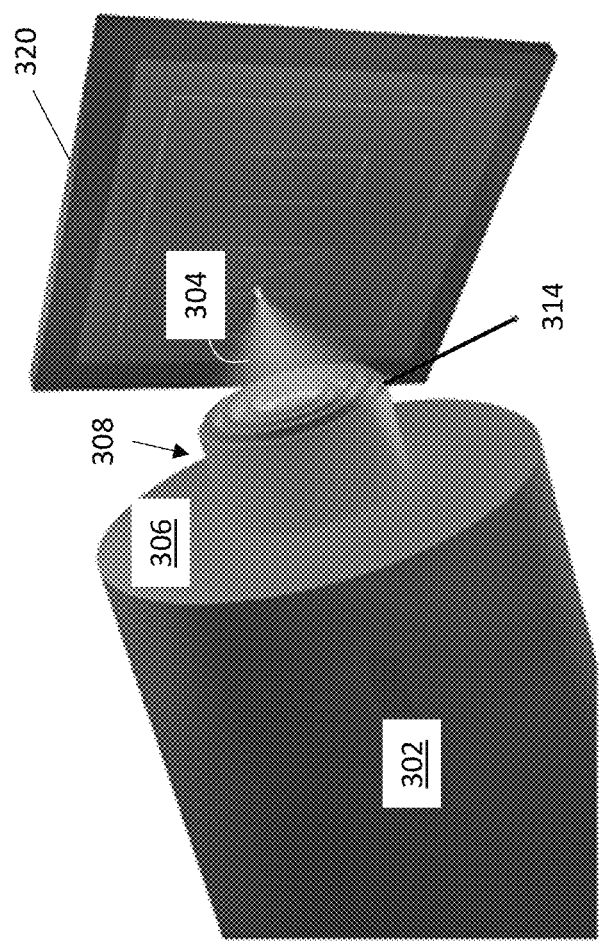
FIG. 4A shows a schematic of a method of using the system of FIG. 3C to fabricate objects.
Figure 4C:
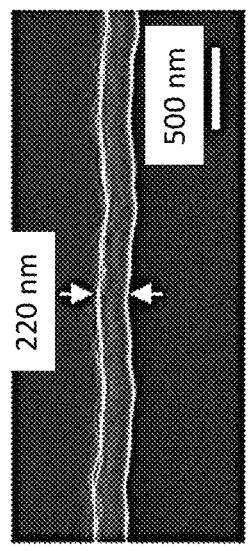
FIG. 4C shows an enlarged view of the smallest line width produced by laser power of 6 mW. The width was measured to be about 220 nm.
Figure 4D:
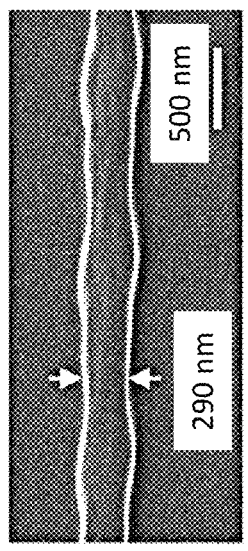
FIG. 4D shows a single line as printed by the commercial two-photon direct laser-writing setup with power 9 mW (Nanoscribe).

Methods for fabricating objects via direct laser lithography are also provided. Using system 300 as an illustrative embodiment, such a method may comprise illuminating, via the optical fiber 302, the photosensitive composition to induce a multiphoton process within the photosensitive composition to generate a first region of an object. FIG. 4A illustrates the method. FIGS. 4B-4C illustrate various two-dimensional (2D) line structures fabricated using system 300. FIG. 4D is a 2D line structure fabricated using a comparative system that does not include a metalens-tipped optical fiber. FIGS. 4A-4C show fabrication by transmitting the light through air into the photosensitive composition. However, as noted above, transmission may be through a liquid, e.g., water, the photosensitive composition, etc. In addition, any desired number of illumination steps in any desired number of locations within the photosensitive composition may be carried out. The illuminated regions may then be developed per standard photolithography techniques to provide the final object. The objects may be three-dimensional (3D) as well as the 2D lines shown in FIGS. 4B-4C.

In a variation of system 300, another illustrative system for fabricating objects via direct laser lithography may include more than one metalens-tipped optical fiber. Such a system may comprise more than two such metalens-tipped optical fibers, e.g., 3 or 4. Each metalens-tipped optical fiber may be positioned within the system to focus light along different optical paths. With respect to this variation, "optical path" refers to an axis defined by a focused light beam from the metalens-tipped optical fiber passing through the photosensitive composition. Different optical paths mean that the corresponding axes are different, i.e., they are not coincident. Each metalens-tipped optical fiber may be characterized by the corresponding optical path it defines. Thus, each metalens-tipped optical fiber having a different optical path illuminates the photosensitive composition along a different axis, i.e., a different direction.

For example, in system 300, the optical fiber 302 is positioned so that the focused light beam propagates along the z-axis as shown in FIG. 3C and illuminates the photosensitive composition along this axis. A second metalens-tipped optical fiber may be included to focus light along a different optical path, e.g., along the x-axis. A third metalens-tipped optical fiber may be included to focus light along another different optical path, e.g., along the y-axis. Still another, a fourth metalens-tipped optical fiber may be included to focus light along a fourth, different optical path within the xyz space. The particular direction along which each metalens-tipped optical fiber focuses the light is not critical, although each direction is different. Variations of system 300 based on the use of two, three, or more metalens-tipped optical fibers enable multi-directional direct laser lithography and improved resolution in each of the multiple directions, thereby allowing for the fabrication of complex objects with high quality. Generally, multiple light sources are used to generate the light to be focused by each metalens-tipped optical fiber. However, a single light source may be used, although such an embodiment would generally employ individual optical switches to turn the light on and off. Illumination with the different metalens-tipped optical fibers may be simultaneous or sequential.

Figure 5:
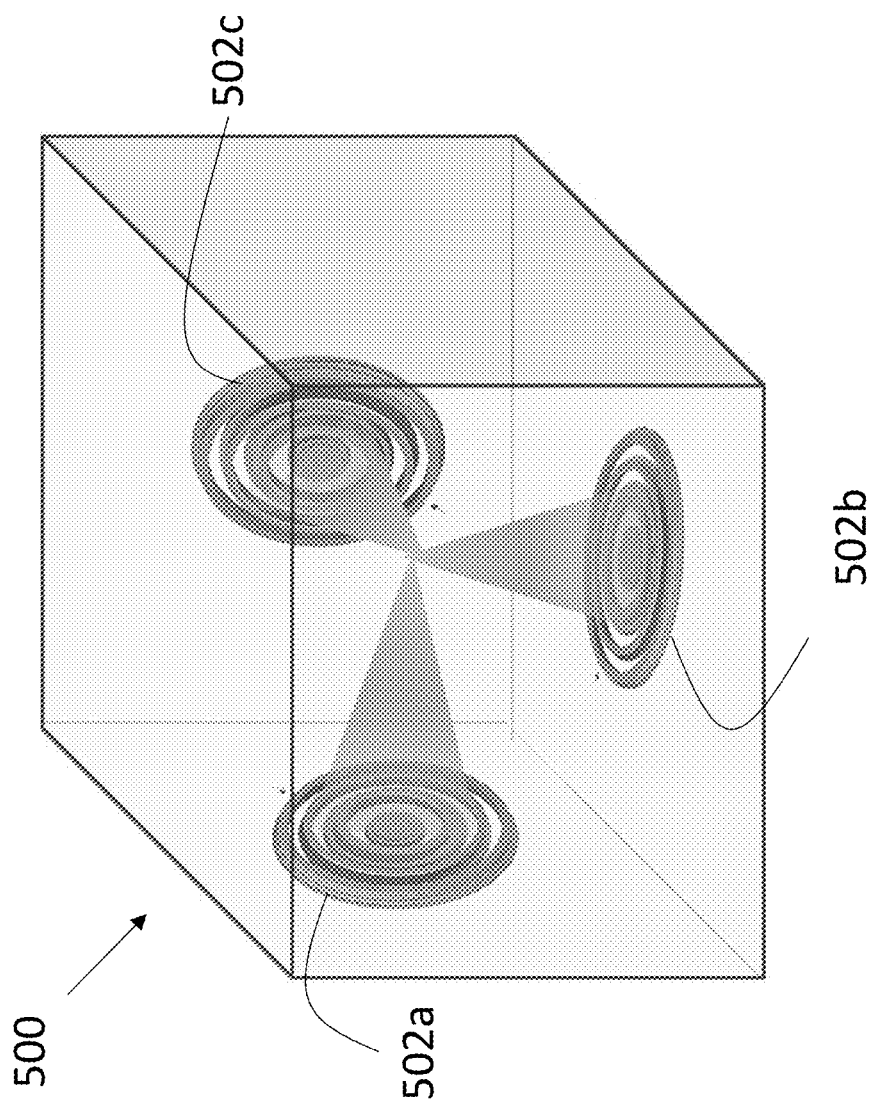
FIG. 5 shows a schematic of an illustrative microfluidic chamber that may be used to carry out embodiments of the disclosed methods.

Thus, the present disclosure also provides a general method for multi-directional direct laser lithography comprising illuminating a photosensitive composition with light focused along a first optical path; illuminating the photosensitive composition with light focused along a second optical path; and illuminating the photosensitive composition with light focused along a third optical path, wherein each of the first, second, and third optical paths are different from one another. Light being focused along a fourth or more optical paths may be used. Each illumination step creates a different desired region of the object being fabricated. The choice of direction and various combinations thereof depend upon the resolution desired in the corresponding direction. Illumination with the different optical paths may be simultaneous or sequential. As described above, the focused light may be provided by metalens-tipped optical fibers, such as optical fiber 302. However, other embodiments may be used. For example, a microfluidic chamber comprising walls may be used to contain the photosensitive composition. Two, three, or more different walls may each comprise a metalens to focus incoming light. Since each wall defines a different plane, each focused light beam will propagate along different optical paths. This embodiment is illustrated in the schematic shown in FIG. 5. A microfluidic chamber 500 comprises walls, three of which each comprise a metalens 502a-c (only the optically active surface is shown) to focus incoming light along different optical paths. The photosensitive composition may be provided on a build platform within the microfluidic chamber 500.

Example

Introduction

An inverse-designed metalens was designed and fabricated on an optical fiber tip via a 3D direct laser-writing technique through two-photon polymerization. A computational inverse-design method based on an objective-first algorithm was used to design a thin circular grating-like structure to transform the parallel wavefront into a spherical wavefront at the near-infrared range. With a focal length about 8 μm at an operating wavelength of 980 nm and an optimized focal spot at the scale of 100 nm, the metalens platform is suitable for two-photon direct laser lithography. The use of the fabricated metalens in a direct laser lithography system was demonstrated. The platform, which combines the 3D printing technique and the computational inverse-design method, enables the fabrication and integration of multiscale and multiple photonic devices with complex functionalities.

The design of the lens began with defining an objective that will transform the parallel wavefront into a spherical wavefront. As a requirement for focusing, the phase at the end of the design domain must satisfy the equation $$\phi(y) = \frac{2\pi}{\lambda} f \left[ \sqrt{1 + \left(\frac{y}{f}\right)^2} - 1 \right] \text{ (modulo } 2\pi\text{)}$$

with f being the focal distance from the end of the design domain. For this study, the focal distance was set as 7.5λ, of the working wavelength, λ. The width of the design domain in the axis of the wave propagation was set as 1.5λ to accommodate a sufficient phase change. The height of the domain was set as 15λ.

The inverse-design algorithm started by defining a "black box" in a two-dimensional xy-plane, a region where the permittivity distribution was allowed to change. Once the objective was defined, the algorithm was allowed to optimize the design domain to find a structure that closely matched the objective with the constraint of a satisfied Maxwell equation. In short, the algorithm took the material permittivity ε and the electric (E) or magnetic (H) field and cast them into a linear algebraic minimization problem of $$\min \left\| \nabla \times \frac{1}{\epsilon} \nabla \times H - w^2 H \right\|$$

where w is the frequency at which the device operates. This nonlinear optimization can be decomposed into two subproblems where one variable (ε or E) is fixed while alternatively trying to solve the other within one single iteration.

Two dependent optimization processes were carried out at the same time for each iteration, namely continuous and binarization processes. Initially, for the continuous optimization, the permittivity was allowed to change continuously over the design domain with a limit of epsilon of air ($\epsilon_{air}$) and the permittivity of the material choice ($\epsilon_{mat}$), for instance eau. $\epsilon_{air} \leq \epsilon \leq \epsilon_{mat}$. However, a binary device consisting only of air and the material of choice is desired for practical fabrication purposes. For this reason, another binarization optimization process step was carried out. This was done by setting a threshold value, where if the value of the permittivity in the design domain was less than said value, it was converted to the epsilon of air while the value above the threshold was converted to the epsilon of the material. It is also worthwhile to mention that the initial value of the design domain permittivity was set to be uniform. As with many optimization problems, a different initial value of permittivity may result in a different final result. One unique attribute to the objective-first inverse-design method is that the optimized structures generally end up being nonintuitive, as clearly shown by the optimized lens in FIG. 1A.

Figure 1B:
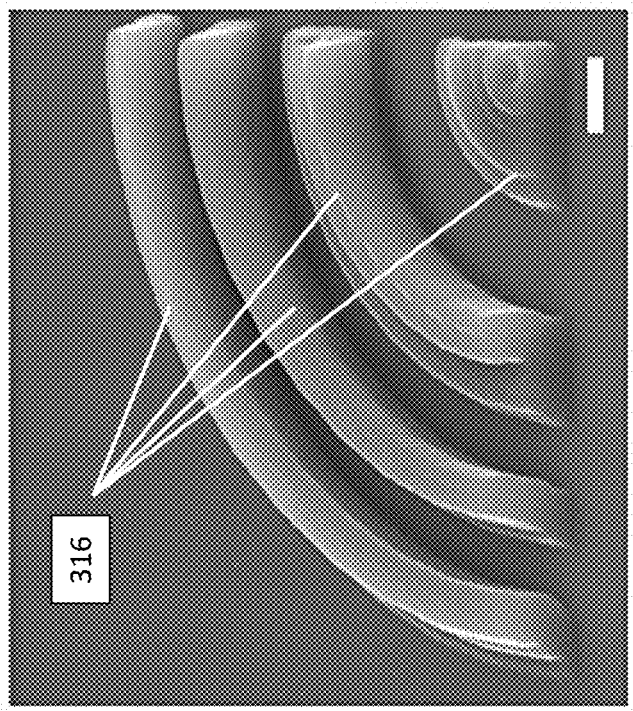
FIG. 1B shows a scanning electron microscope (SEM) image of a sliced fabricated metalens for characterization purposes. The scale bar shown is 2 µm.
Figure 1A:
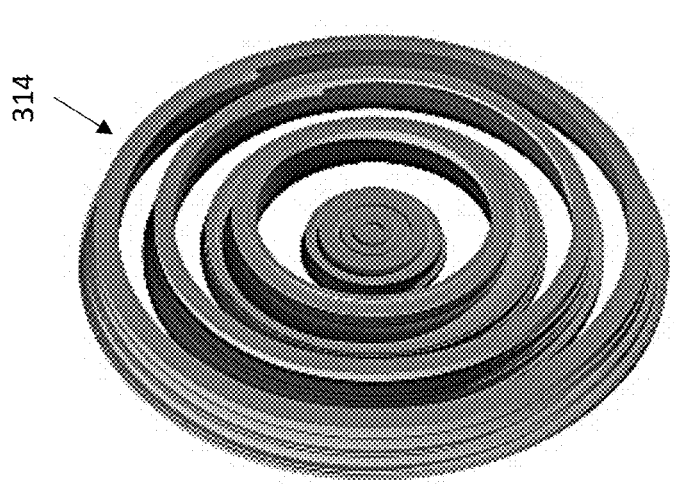
FIG. 1A shows the optically functional surface of a metalens that may be used in an illustrative system for fabricating objects via direct laser lithography.
Figure 2B:
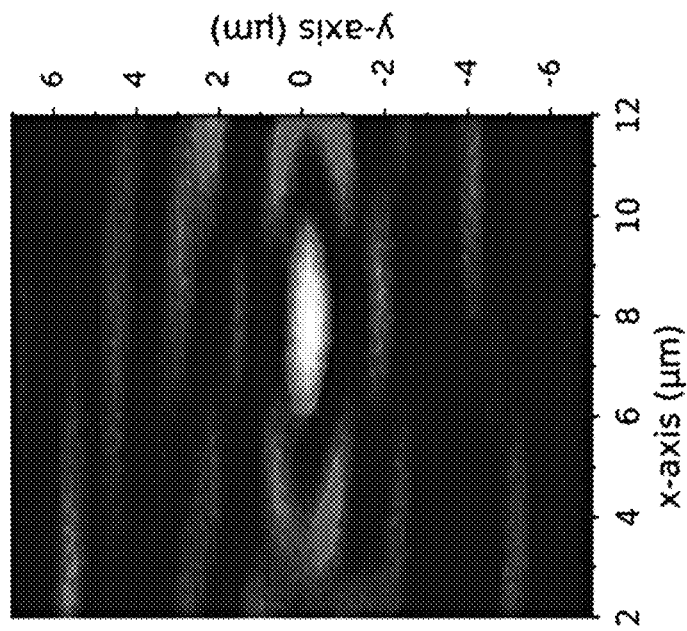
FIG. 2B shows the intensity profile of the metalens as measured experimentally. The focal length of the metalens appeared at 7.8 µm.
Figure 2A:
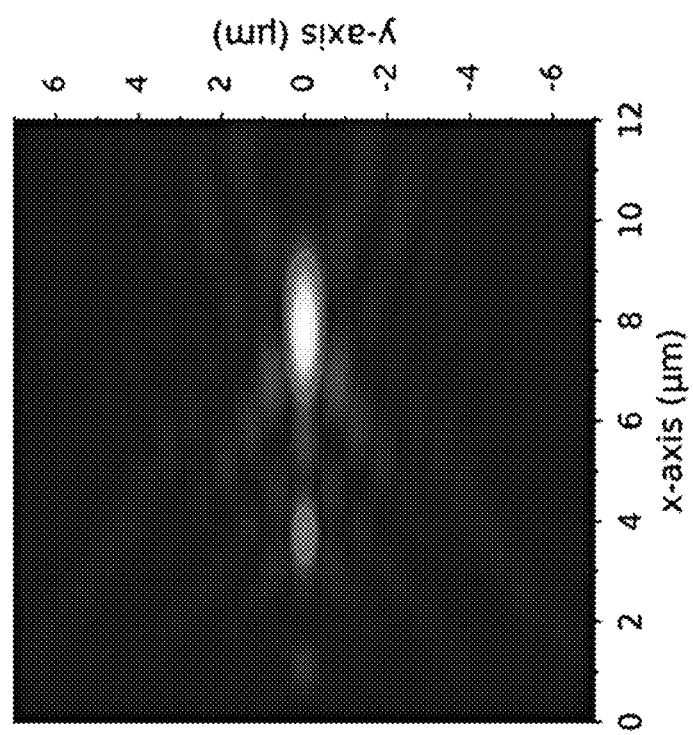
FIG. 2A shows a simulated intensity profile of the metalens in the xy-plane at 980 nm. The focal spot of the metalens appears at 7.7 µm.

To obtain a full three-dimensional lens, the rotational symmetry of the 2D lens obtained above was utilized. The lens was rotated around its middle axis to create the 3D lens, as shown in FIG. 1A. However, it was necessary to scale the design to compensate the rotational symmetry from a 2D structure. To achieve the same focal distance of 7.5λ, the scaling factor was determined to be 1.7. To validate the performance of the lens, a full-wave 3D simulation was carried out in a commercial finite-difference time-domain (FDTD) Maxwell equation solver (Lumerical Inc.). By virtue of the Maxwell equations' scalability properties and considering that the material used was relatively nondispersive, the lens was scaled to operate at 980 nm. All other dimensions scaled accordingly. The outer diameter of the lens operating at 980 nm was 24.8 μm with a height of 2.5 μm. The simulated field profile of the lens sliced along the axis is shown in FIG. 2A. The result agrees well with the expected focal distance of around 7.5λ. The focusing efficiency, which was determined by the integrated intensity at the full-width at half-maximum, was calculated to be 76%.

Figure 2C:
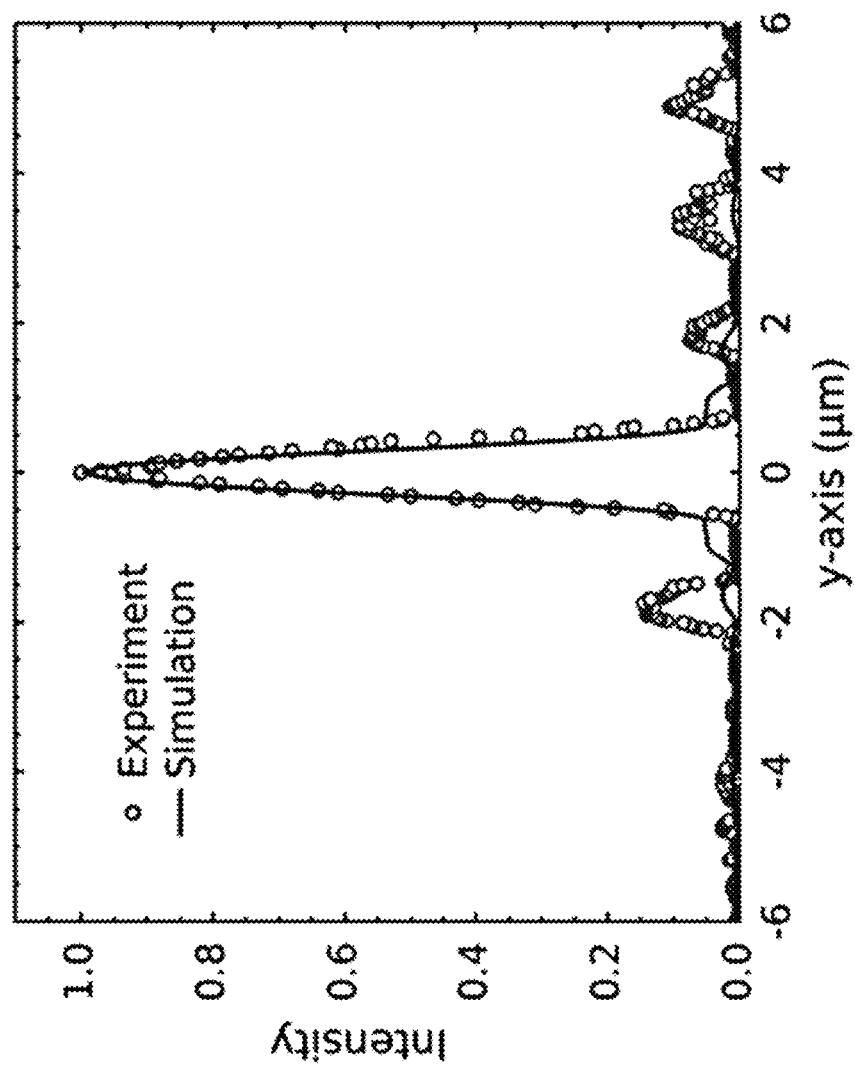
FIG. 2C shows a comparison of simulated and measured intensity profiles at the focal plane of the metalens.

To experimentally verify the performance of the lens design, the lens was first fabricated on top of a glass substrate (see Methods below). FIG. 1B shows the sliced portion of the fabricated lens for convenience. A homemade optical setup was used to measure the field profile along the axis of propagation. The focusing performance was clearly observed experimentally and agreed quite well with the simulated result, as shown in FIGS. 2A and 2B, respectively. The measured focal length of 7.8 μm agreed closely with the simulated result of 7.7 μm. Accordingly, the calculated NA was ~0.85. The beam diameter maximum, which is defined as the full width at $e^{-2}$ ($\approx 0.135$), was 1.1 μm, as measured following FIG. 2C. The focusing efficiency, which was measured by the amount of power passing through the beam diameter, was measured to be 73%. This efficiency was slightly lower than the simulated result of 76%, as it also accounted for experimental errors and the fact that the lens was fabricated on a glass substrate, adding additional loss. Furthermore, the light source incident on the lens was considerably larger than the whole dimension of the lens, adding losses due to scattering that appeared as side loops in the intensity profile. This issue can be eliminated by preparing a small aperture of a reflective metal layer surrounding the lens.

The slight deviation from the predicted focal length may also be attributed to the fact that the fabricated lens is not exactly true to the optimized geometry. In other words, the lens may end up slightly larger or smaller with an offset as a result of being underdeveloped or overdeveloped, respectively. The slight dimension mismatch may result in a change in the measured focal length.

To further demonstrate the application of the inverse-designed metalens device, it was integrated with a fiber tip and the system was used as one of the main optical components in a direct laser-writing setup. Having the fiber-tip lens freely move around also allowed for direct laser-writing in any substrate type or environment, which is generally prohibitive for a conventional direct laser-writing setup. Thanks to its relatively easy and simple fabrication process, the fiber-tip-based optical system is a much more economical alternative and at the same time can be potentially disposable. It shows advantages such as high-efficiency coupling, less transmission loss, flexible space movement, etc.

Almost analogous to the process of the printing of the fiber-tip lens itself, the fabricated lens was used to focus the light in a homemade two-photon polymerization setup. In short, the process of two-photon polymerization can be explained as follows: as the light passing through the lens is focused, it creates a voxel at a focal point with a certain dimension depending on the power of the light. A fraction of the volume of the resin in which the light intensity is sufficiently above the threshold will be polymerized. Combining this with the scanning of either the sample stage or the tip allows one to create a true 3D structure. Owing to the fact that the polymerization is a threshold process, it is not limited to the optical diffraction limit. By delicately adjusting the process parameters, particularly the focusing condition, a feature size on the order of 200 nm with a high accuracy and precision can be achieved.

The lens was printed on the tip of a single-mode fiber (SMF) (see Methods below). Note that the diameter of the core of the fiber was around 9 μm, which means that the immediate beam size coming out of the fiber was much smaller than the overall lens diameter. To accommodate the slightly larger lens diameter, a buffer layer was added between the fiber end and the lens to allow the beam coming out of the fiber to slightly expand to the size of the lens. The buffer layer also ensured that the metalens was successfully printed atop the fiber. The fabricated lens on top of a SMF is shown in FIG. 3A, and an enlarged view is shown in FIG. 3B. For the purpose of direct laser writing, the lens was scaled to work at a wavelength of 780 nm.

The complete fiber tip lens was then integrated into a homemade direct laser-writing setup with an input of a femto-second laser source operating at 780 nm, as shown in FIG. 3C. The movement of the fiber tip was controlled via a multiple-axis piezo stage in both the x- and y-directions. The z-position of the fiber tip lens was manually set for the writing process but can be automated for future reference. For testing purposes, the same resin used to print the lens itself, IP-Dip, was used. The resin was spin coated on a glass substrate at 3600 rpm, resulting in a thickness of a few microns. For a trial, a simple "NU" lettering was designed. The sample pattern of direct laser writing using the inverse-designed fiber-tip lens can be seen in FIG. 4A. From FIGS. 4A-4D, it is apparent that successful writing was achieved.

The dimension of the written line from a single pass, and therefore the resolution, was greatly dependent on the power of the input of the laser. FIG. 4B shows the change in the line width for different laser powers. As the power increased, the volume of the interaction increased accordingly and thus increased the width of the written lines. The smallest width of 220 nm was successfully achieved with a power of 6 mW, accounting for the coupling loss as shown in FIG. 4C. The slight irregularity in the shape of the line shown in FIG. 4C was due to the instability of the stage and can be further improved by integrating the setup with an active vibration isolation. For comparison, a similar single-line pass was printed using the two-photo direct laser-writing system (Nanoscribe) used to fabricate the metalens. The smallest line width obtained for the existing configuration of the direct laser writer at the inventors' disposal was measured to be 290 nm, as shown in FIG. 4D. The line was printed at a laser power of around 9 mW. For any laser power below 9 mW, the lines were not well-defined. The simple homemade setup produced a smaller line width when compared to that of the commercial direct laser writer. Overall, considering the flexibility of usage and cost-effectiveness of the fiber-tip lens, it offers a great alternative for a simple two-photon direct laser-writing setup.

Conclusion

In summary, an inverse-designed metalens was successfully designed and experimentally demonstrated to work in a near-infrared wavelength. By taking advantage of rotational symmetry, a 3D lens was constructed from the 2D-optimized lens. Great agreement between the simulation and the experimental observation was obtained. A focusing efficiency of 73% with a considerably high NA of 0.85 were realized from the lens. The further application of the lens in a two-photon polymerization (2PP) process was realized. By fabricating the lens on the SMF tip, it can be used to focus light for two-photon direct laser writing. The smallest feature of approximately 200 nm was achieved by carefully adjusting the focusing condition during the direct writing process. The result shows the effectiveness of the proposed inverse design and the 2PP process. This combination of methods can be further implemented to design and fabricate various fiber-tip optical elements suitable for any applications.

Methods

A full-wave 3D simulation using a Maxwell finite-difference time domain (FDTD) was carried out to verify the performance of the inverse-design-optimized structure. A plane wave at 980 nm was used as a light source at the back of the lens structure. The structure of the lens was scaled to work in 980 nm. Perfectly matched layer (PML) boundary conditions were set in all directions. Field monitors were placed in the axis of propagation.

The optimized inverse-designed lens was fabricated via a two-photon polymerization method using a commercial system (Nanoscribe). The lens was fabricated in an immersed mode with a 63× objective lens and IP-Dip photoresin. A femtosecond laser at 780 nm wavelength with approximately 80 MHz repetition frequency was used. With this combination, it was possible to achieve a resolution down to 100 nm. The metalens was fabricated on a fused silica slide in a dip-in mode where the objective lens of the system was immersed into the photoresist, and then the metalens was printed layer-by-layer vertically on top of the substrate. The sample was then developed in propylene glycol monomethyl etheracetate (PGMEA), rinsed in isopropanol, and dried. The fabricated metalens was used in the field measurement shown in FIGS. 2A-2C. Typical postprinting development was performed in the PGMEA solution for 20 min, which was immediately followed by the IPA rinse.

To measure the field profile of the fabricated lens, a homemade setup was built. A laser operating at 980 nm was used as a light source, which fed into a collimator to collimate the beam incident on the fabricated lens. A lens objective of 63× mounted on piezo stage was placed directly in front of the inverse-designed lens to capture the intensity of the plane at its working distance. The image was then recorded by a CCD camera (AMScope) placed directly behind the objective lens. By gradually moving the objective lens along the axis of wave propagation and recording the image at each step, a three-dimensional intensity distribution can be obtained. A step of 100 nm was used in the measurement.

To demonstrate the application of the fiber-tip lens, a direct laser writing system for two-photon polymerization was prepared. First, the inverse-designed lens was printed on a SMF. The SMF was cleaved first and mounted by a fiber mounter. The objective with a drop of photoresist was brought close to the SMF to find the interface, and then a microscopic z stage was used to print the device layer-by-layer. After fabrication, the device was developed by PGMEA and then rinsed by isopropanol. The fiber was then coupled with a femto-second 780 nm laser (Spectra-Physics) and mounted on a fiber holder, which itself was placed on a controllable moving stage (Thorlab Z812). Second, a photosensitive resin was spin coated on top of a glass substrate. The fiber-tip lens was then positioned perpendicular to the substrate and scanned according to the desired pattern. Powers ranging from 6 to 9 mW were varied to test the resolution of the direct laser writing. The substrate was subsequently developed in a PGMEA solution. The exposed area was polymerized, and the unexposed area was dissolved in the solution, leaving the patterned area intact.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more."

If not already included, all numeric values of parameters in the present disclosure are proceeded by the term "about" which means approximately. This encompasses those variations inherent to the measurement of the relevant parameter as understood by those of ordinary skill in the art. This also encompasses the exact value of the disclosed numeric value and values that round to the disclosed numeric value.

The foregoing description of illustrative embodiments of the disclosure has been presented for purposes of illustration and of description. It is not intended to be exhaustive or to limit the disclosure to the precise form disclosed, and modifications and variations are possible in light of the above teachings or may be acquired from practice of the disclosure. The embodiments were chosen and described in order to explain the principles of the disclosure and as practical applications of the disclosure to enable one skilled in the art to utilize the disclosure in various embodiments and with various modifications as suited to the particular use contemplated. It is intended that the scope of the disclosure be defined by the claims appended hereto and their equivalents.

What is claimed is:

1. A method of fabricating an object via direct laser lithography, the method comprising:
   (a) illuminating, via an optical fiber having an end facet and a metalens directly on the end facet, a location within a photosensitive composition from which an object is to be fabricated with light, thereby inducing a multiphoton process within the photosensitive composition to generate a region of the object; and
   (b) repeating the illuminating step one or more additional times at one or more additional locations to generate one or more additional regions of the object, wherein the metalens comprises an expansion waveguide having opposing end surfaces, wherein one end surface is mounted directly on the end facet and the opposing end surface is an optically functional end surface of the metalens.

2. The method of claim 1, wherein the optically functional end surface of the metalens is shaped as a plurality of raised concentric rings.

3. The method of claim 1, further comprising a buffer layer between the metalens and the end facet.

4. The method of claim 1, wherein the illuminating steps (a) and (b) transmit the light from the metalens of the optical fiber to the location through a liquid, rather than through air.

5. A method of fabricating an object via direct laser lithography, the method comprising:
(a) illuminating, via an optical fiber having an end facet and a metalens directly on the end facet, a location within a photosensitive composition from which an object is to be fabricated with light, thereby inducing a multiphoton process within the photosensitive composition to generate a region of the object; and
(b) repeating the illuminating step one or more additional times at one or more additional locations to generate one or more additional regions of the object, the method further comprising
(c) illuminating, via one or more additional optical fibers, the photosensitive composition, each optical fiber having a corresponding end facet and a corresponding metalens directly on the corresponding end facet, wherein the first optical fiber and the one or more additional optical fibers are characterized by different optical paths.

6. The method of claim 5, wherein a total number of optical fibers being used in the method to fabricate the object is three or four.

7. The method of claim 5, wherein step (c) occurs simultaneously with step (a).

8. A method of fabricating an object via multi-directional direct laser lithography, the method comprising:
(a) illuminating a photosensitive composition with light focused along a first optical path, thereby inducing a multiphoton process within the photosensitive composition to generate a region of the object;
(b) illuminating the photosensitive composition with light focused along a second optical path different from the first optical path, thereby inducing another multiphoton process within the photocenter composition to generate a second region of the object; and
(c) illuminating the photosensitive composition with light focused along a third optical path different from the first and second optical paths, thereby inducing another multiphoton process within the photosensitive composition to generate a third region of the object.

9. The method of claim 8, wherein steps (a)-(c) are carried out simultaneously.

10. The method of claim 8, further comprising (d) illuminating the photosensitive composition with light focused along a fourth optical path different from the first, second, and third optical paths, thereby inducing another multiphoton process within the photosensitive composition to generate a fourth region of the object.

11. The method of claim 8, wherein steps (a)-(c) are carried out using individual optical fibers, each optical fiber having a corresponding end facet and a corresponding metalens directly on the corresponding end facet.

12. The method of claim 11, wherein each corresponding metalens has an optically functional end surface that is shaped as a plurality of raised concentric rings.

13. The method of claim 11, wherein each corresponding metalens comprises an expansion waveguide having opposing end surfaces, wherein one end surface is mounted directly on the corresponding end facet and the opposing end surface is an optically functional end surface of the metalens.

14. The method of claim 13, wherein the optically functional end surface of each metalens is shaped as a plurality of raised concentric rings.

15. The method of claim 13, further comprising a buffer layer between each corresponding metalens and each corresponding end facet.

\* \* \* \* \*